United States Patent
Nejedlo et al.

(10) Patent No.: US 7,464,307 B2
(45) Date of Patent: Dec. 9, 2008

(54) HIGH PERFORMANCE SERIAL BUS TESTING METHODOLOGY

(75) Inventors: Jay J. Nejedlo, Wilsonville, OR (US); Mike Wiznerowicz, Beaverton, OR (US); David G. Ellis, Tualatin, OR (US); Richard J. Glass, Olympia, WA (US); Andrew W. Martwick, Folsom, CA (US); Theodore Z. Schoenborn, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 472 days.

(21) Appl. No.: 10/396,071

(22) Filed: Mar. 25, 2003

(65) Prior Publication Data

US 2004/0204912 A1    Oct. 14, 2004

(51) Int. Cl.
*G01R 31/28* (2006.01)
*G06F 11/00* (2006.01)

(52) U.S. Cl. ...................... 714/712; 714/738

(58) Field of Classification Search ......... 714/733–734, 714/30, 738, 712, 758; 370/248, 366; 710/311, 710/71
See application file for complete search history.

(56) References Cited

U.S. PATENT DOCUMENTS

| | | | |
|---|---|---|---|
| 4,507,781 A * | 3/1985 | Alvarez et al. ............... 370/266 |
| 5,726,991 A | 3/1998 | Chen et al. | |
| 5,732,209 A * | 3/1998 | Vigil et al. .................... 714/30 |
| 6,009,488 A | 12/1999 | Kavipurapu | |
| 6,065,077 A * | 5/2000 | Fu ............................... 710/100 |
| 6,080,203 A * | 6/2000 | Njinda et al. .................. 716/4 |
| 6,292,911 B1 * | 9/2001 | Swanson ..................... 714/715 |
| 6,357,026 B1 * | 3/2002 | Hoang et al. ................. 714/727 |
| 6,357,027 B1 * | 3/2002 | Frankowsky ................. 714/738 |
| 6,363,506 B1 * | 3/2002 | Karri et al. ................... 714/733 |
| 6,385,236 B1 * | 5/2002 | Chen ........................... 375/224 |
| 6,457,087 B1 * | 9/2002 | Fu ............................... 710/305 |
| 6,505,317 B1 | 1/2003 | Smith et al. | |
| 6,609,221 B1 * | 8/2003 | Coyle et al. ................... 714/715 |
| 6,701,272 B2 * | 3/2004 | Cooper et al. ................ 702/132 |
| 6,826,100 B2 * | 11/2004 | Ellis et al. .................... 365/201 |
| 6,880,118 B2 * | 4/2005 | Chen et al. ................... 714/727 |
| 6,931,505 B2 * | 8/2005 | David .......................... 711/167 |
| 7,024,510 B2 * | 4/2006 | Olarig ......................... 710/311 |
| 7,047,458 B2 * | 5/2006 | Nejedlo et al. .............. 714/715 |
| 7,225,370 B2 * | 5/2007 | Chow et al. ................. 714/700 |
| 7,340,555 B2 * | 3/2008 | Ashmore et al. ............ 710/313 |
| 2004/0064457 A1 * | 4/2004 | Zimmer et al. ............. 707/100 |
| 2004/0117709 A1 * | 6/2004 | Nejedlo et al. ............. 714/738 |
| 2005/0129057 A1 * | 6/2005 | Chen et al. .................. 370/462 |

OTHER PUBLICATIONS

PCT Searh Report, PCT/US2004/004219, mailed Nov. 5, 2004.

* cited by examiner

*Primary Examiner*—Phung M Chung
(74) *Attorney, Agent, or Firm*—Blakely, Sokoloff, Taylor & Zafman LLP (57) ABSTRACT

According to one embodiment, a built-in self test (IBIST) architecture/methodology is disclosed. The IBIST provides for testing the functionality of an interconnect (such as a bus) between a transmitter and a receiver component. The IBIST architecture includes a pattern generator and a pattern checker. The pattern checker operates to compare a received plurality of bits (for the pattern generator) with a previously stored plurality of bits.

20 Claims, 7 Drawing Sheets

HIGH PERFORMANCE SERIAL BUS TESTING METHODOLOGY

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to testing the correct operation of a data interconnect; more particularly, the present invention relates to testing a point-to-point serial interconnect.

BACKGROUND

Computing devices and systems include components (such as circuit boards and silicon components) as well as interconnects and interfaces between various components. During design of such systems, and prior to distribution to consumers, these interconnects may be tested to determine their proper functionality. However, as component to component bus speeds increase and circuit boards become smaller, testing these bus connections becomes increasingly difficult and in some cases impossible.

Board level features such as in-circuit test points have been eliminated on high performance buses (e.g., speeds greater than 200-500 MHz) due to board/component electrical issues. As bus speeds increase beyond 500 MHz., additional testability features such as boundary scan may also be reduced and/or eliminated due to restricted timing budgets. Further, the board/system interconnect fault spectrum associated with high speed system buses has expanded beyond simple opens/shorts due to limited tolerance to transmission line loss, impedance discontinuities, return path discontinuities, intersymbol interferences (ISI), crosstalk, power supply collapse, nonlinear driver effects, non-optimum $V_{OH}$, $V_{OL}$ levels, non-ideal termination and uncentered Vref, for example.

Testing processes may be employed to address the associated interconnect fault spectrum. One test process may use a system level environment (board functional test) incorporating a significant amount of hardware to accomplish the testing in a high volume manufacturing (HVM) test environment. This may be expensive and time consuming. Additionally, this type of testing may not provide full coverage and may have poor diagnostic granularity.

Also, a majority of defective components may fail to boot an operating system and thus testing cannot be accomplished. Another process may use physical access such as probing to test points (e.g., in-circuit testers) on the board. However, the probing may be invasive to high speed bus testing, expensive and/or obsolete for buses operating above 200 MHz.

BRIEF DESCRIPTION OF THE DRAWINGS

The invention is illustrated by way of example and not limitation in the figures of the accompanying drawings, in which like references indicate similar elements, and in which.

DETAILED DESCRIPTION

An interconnect built in self test (IBIST) architecture is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
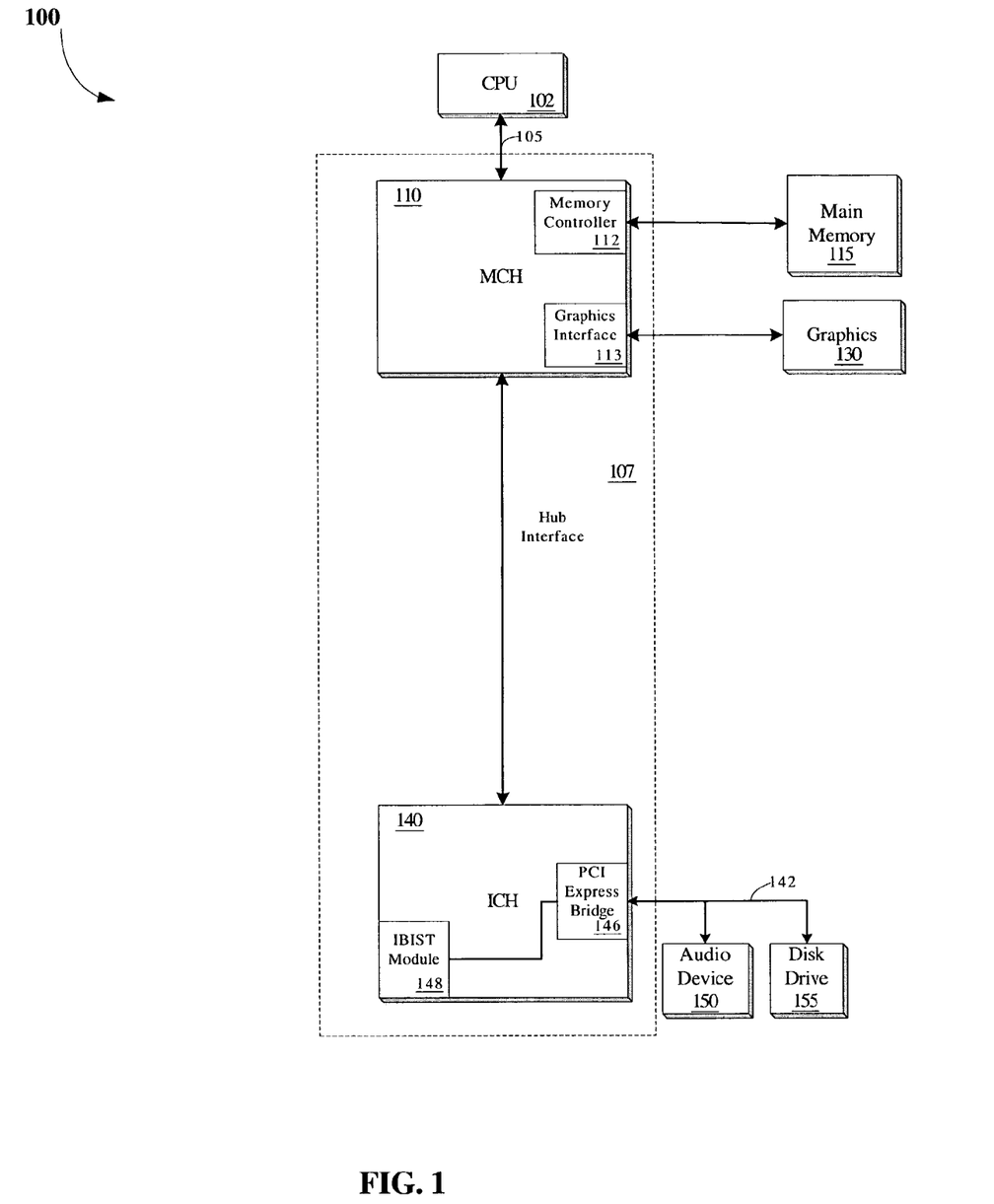
FIG. 1 is a block diagram of one embodiment of a computer system.

FIG. 1 is a block diagram of one embodiment of a computer system 100. Computer system 100 includes a central processing unit (CPU) 102 coupled to bus 105. In one embodiment, each processor is a processor in the Pentium® family of processors including the Pentium® II processor family, Pentium® III processors, and Pentium® IV processors available from Intel Corporation of Santa Clara, Calif. Alternatively, other processors may be used.

A chipset 107 is also coupled to bus 105. Chipset 107 includes a memory control hub (MCH) 110. MCH 110 may include a memory controller 112 that is coupled to a main system memory 115. Main system memory 115 stores data and sequences of instructions that are executed by CPU 102 or any other device included in system 100. In one embodiment, main system memory 115 includes dynamic random access memory (DRAM); however, main system memory 115 may be implemented using other memory types. Additional devices may also be coupled to bus 105, such as multiple CPUs and/or multiple system memories.

MCH 110 may also include a graphics interface 113 coupled to a graphics accelerator 130. In one embodiment, graphics interface 113 is coupled to graphics accelerator 130 via an accelerated graphics port (AGP) that operates according to an AGP Specification Revision 2.0 interface developed by Intel Corporation of Santa Clara, Calif.

In addition, the hub interface couples MCH 110 to an input/output control hub (ICH) 140 via a hub interface. ICH 140 provides an interface to input/output (I/O) devices within computer system 100. ICH 140 may be coupled to a Peripheral Component Interconnect Express bus adhering to a Specification Revision 1.0 bus developed by the Arapahoe Working Group. Thus, ICH 140 includes a PCI Express bridge 146 that provides an interface to a PCI Express bus 142. PCI Express bridge 146 provides a data path between CPU 102 and peripheral devices.

PCI Express bus 142 includes an audio device 150 and a disk drive 155. However, one of ordinary skill in the art will appreciate that other devices may be coupled to PCI bus 142. In addition, one of ordinary skill in the art will recognize that CPU 102 and MCH 110 could be combined to form a single chip. Further, graphics accelerator 130 may be included within MCH 110 in other embodiments.

PCI Express bus 142 is a point-to-point serial interconnection that features isochronous data transport. PCI Express bus 142 enables each device on the bus to have a dedicated link, without arbitrating for a shared bus. In addition, PCI Express uses a packetized and layered protocol structure, and does not require any sideband signaling riding alongside the main serial interconnection (e.g., clock signals are embedded within data packets).

Particularly, PCI Express includes three protocol layers: Transaction, Data Link, and Physical. From the transmitting side of a transaction, packets are formed at the higher layers and each successively lower layer adds more information to the packet, until the packet is transmitted across the physical link to the receiving device. The packet then traverses up the protocol stack at the receiving device until data is extracted and passed to an application.

The Transaction layer assembles and disassembles transaction-level packets used to send requests such as reading and writing data, and handles link configuration and control signals. Further, the Transaction layer ensures end-to-end communications operate error-free with valid data across an entire fabric, between source and destination, even when possibly traversing multiple bridges or switches.

The Data Link layer makes sure data is transferred intact from point to point, implementing ack/nack protocol techniques, and error detection and correction. The Physical layer, as described above, is the physical link by which data is transmitted from one device to another.

Figure 2:
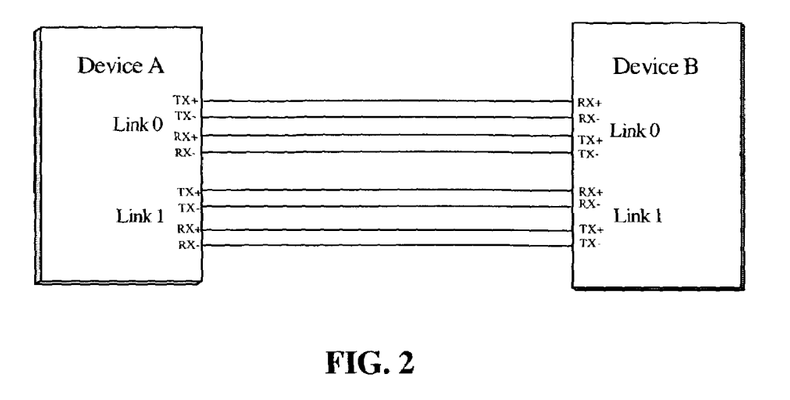
FIG. 2 illustrates one embodiment of devices coupled via a PCI Express interface.

In addition, each device implementing PCI Express includes one or more links. A PCI Express link may be comprised of multiple "lanes". FIG. 2 illustrates one embodiment of devices coupled via a PCI Express interface. Each lane is comprised of the two differentially driven pair of wires (transmit and receive) of a basic link. The lanes typically scale from 2.5 Gbit/sec in each direction to 10 Gbits/sec and beyond in the future. Multiple lanes can be connected between devices, chips, etc.

According to one embodiment, PCI Express links can be configured in ×1, ×2, ×4, ×8, ×12, ×16, and ×32 lane widths. Given a ×1 link has 2 wires (one differential signal pair, one in each direction), a ×16 link would have 16 differential signal pairs in each direction, or 32 differential signal pairs for bi-directional data transfer.

Although the disclosed embodiment describes the PCI Express technology, one of ordinary skill in the art will appreciate that bridge 146 and bus 142 may be replaced by with other types of serial interface technologies without departing from the true scope of the invention.

Referring back to FIG. 1, ICH 140 also includes IBIST module 148. IBIST module 148 is used to implement an IBIST testing methodology, which facilitates at-speed system level interconnect testing/debugging of PCI Express bus 142. According to one embodiment, the IBIST testing methodology operates with any PCI Express standard 1.0 compliant device.

In a further embodiment, the IBIST testing methodology for PCI Express focuses on testing each individual lane. Consequently, each lane includes independent IBIST configuration capabilities, control capabilities, which include a full compliment of debug capabilities, and execution capabilities. However in other embodiments, lane-to-lane interaction is tested.

Figure 3:
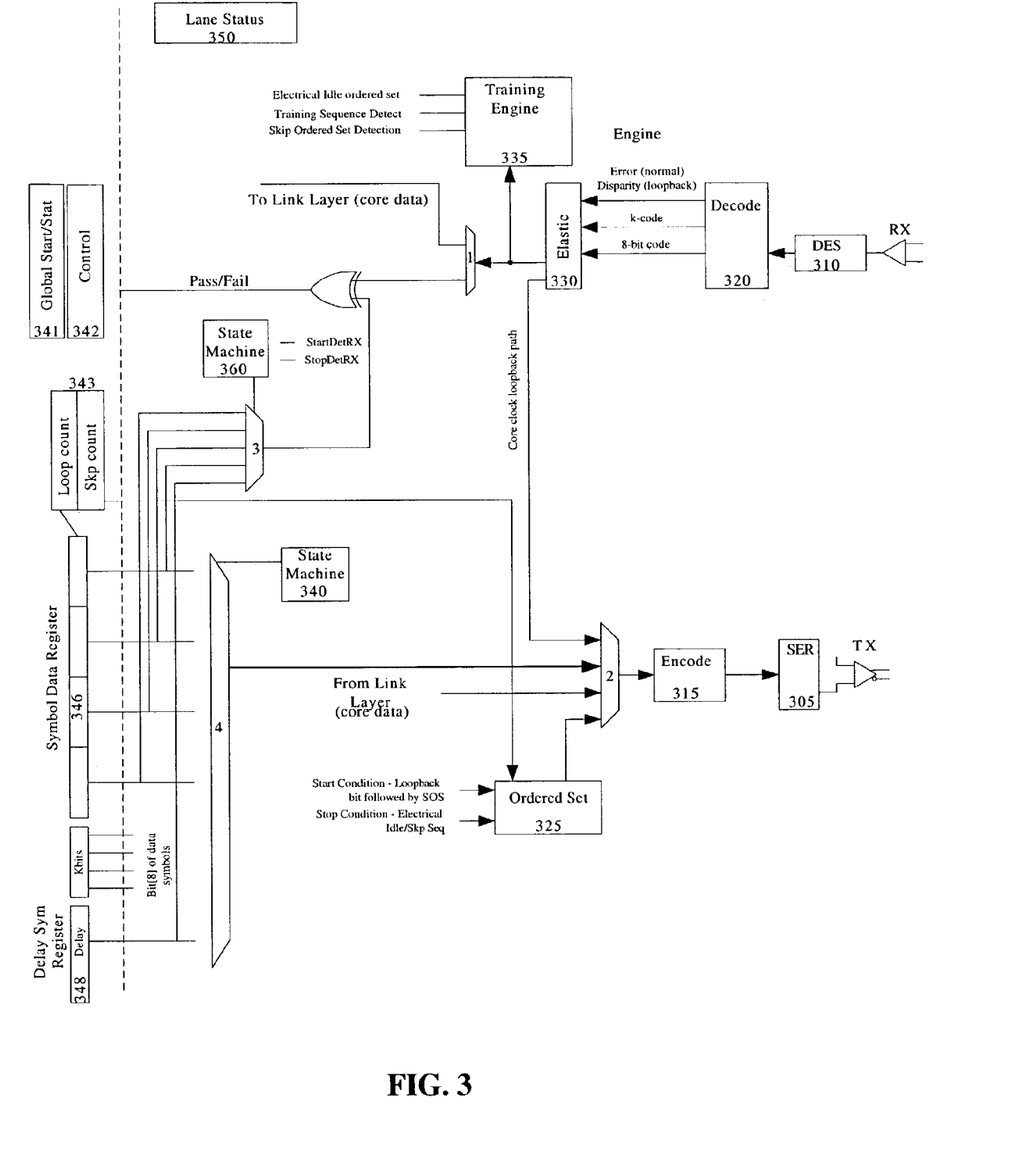
FIG. 3 is a block diagram of one embodiment of an interconnect built in self test (IBIST) architecture.

FIG. 3 illustrates one embodiment of IBIST module 148 lane architecture. According to one embodiment, the IBIST functionality is fully decoupled from the core and operates in the PCI Express physical layer. Thus, IBIST test patterns are not mandated to follow the standard PCI express protocol for link or transaction layer data transfers (e.g., the transaction and link layer functionality is turned off in IBIST test mode).

According to a further embodiment, IBIST module 148 directly controls data transmission on all lanes. Further, IBIST module 148 enables independent testing of the individual lanes within a link (e.g., IBIST facilitates independent control of each lane within a link) controls each PCI Express lane in a link. Table 1 below lists the basic features provided by IBIST module 148. In one embodiment, the complete list of features is defined in a user-accessible register set described below.

Referring to FIG. 3, IBIST module 148 includes serializer 305, de-serializer 310, encoder 315, decoder 320, ordered set transmitter 325, elastic buffer 330 and training engine 335. In addition, IBIST module 148 includes, state machine 340, global start/status register 341, control register 342, loop counter/skip counter register 343, symbol data register 346 and delay symbol register 348. Further, lane status register 350, error checking state machine 360, and multiplexers 1-4 are included within IBIST module 148.

According to one embodiment, serializer 305, de-serializer 310, encoder 315, decoder 320, ordered set transmitter 325, elastic buffer 330 and training engine 335 are PCI Express lane components that are incorporated for the IBIST test methodology. Serializer 305 serializes data that is to be transmitted from the transmitter of a lane, while the de-serializer 310 de-serializes the data once the data is received at the receiver.

TABLE 1

| Capability | Feature | Function & Usage Model |
| --- | --- | --- |
| IBIST Access | BIOS Access | Programmatic (config. space) access is required feature for upstream (master) devices. The ability to initiate a read and write to the control registers and pattern memory is a minimum requirement. |
| | JTAG (& ITP) Access | ITP/XDP access is required. Access through the JTAG TAP access is required to support industry enablement (HVM/End-customer). This does not mean that the registers are on a JTAG chain; just that JTAG can initiate a read and write to the control registers and pattern memory. |
| | SM/FW Bus Access | SM bus port (I2C) access is required, IBIST must be accessible through the port. The ability to initiate a read and write to the control registers and pattern memory is a minimum requirement. |

TABLE 1-continued

| Capability | Feature | Function & Usage Model |
|---|---|---|
| Loopback control | Loopback Master | Downstream ports (lanes) must be able to be configured as a Loopback master as part of IBIST mode entry (i.e. signaling the connected device upstream port to enter Loopback while preventing itself from entering Loopback). This prevents a loop between the two devices. (This is standard PCI Express feature). |
| | 10 bit relay of Loopback data | Basic Loopback mode (non IBIST) is defined as preserving the disparity of the repeated symbols. (This is standard PCI Express feature). |
| | NOTE concerning Industry Enabling | For Slave devices only, special accommodations within the PCI Express Standard enables IBIST Usage. An "IBIST" override has been defined as feature of the External Loopback mode. |
| IBIST control | Enter IBIST mode | Ability to select IBIST mode (i.e. disconnect the Link Layer, similar to DISABLE slate) and automatically load default patterns (for both master and slave). |
| | Delay Symbol | The delay symbol for CMM style lane inversion consists of a 10-bit data token (as a 9 bit decoded value). Required for EMI/Cross-talk testing. |
| | Default pattern load | When exiting reset, symbol data register 346 is automatically initialized to the default Fixed mode pattern. |
| | Custom pattern load | Ability to Preload pattern memory with custom pattern. |
| | Pattern Memory sequence definition | A single sequence definition is required and consists of 4 10-bit data tokens (as a 9 bit decoded value), and a 12-bit loop count. |
| | Inversion/Delay Width | Ability to cycle delay symbols through groups of 4 or 8 lanes (as in CMM mode). |
| | IBIST test begin | A single control bit initiates, and begins the IBIST execution |
| Debug features | Training Failures | In the case where a lane fails to train/enter loopback (the far side responding with Loopback set) include mode to enable the start of the IBIST test. |
| | Configuration of: Lane polarity, initial disparity and speed. | Ability to set the initial disparity before sending any data. Ability to set the lane polarity and speed for each lane before beginning test. |

Encoder 315 encodes the data transmitted from the transmitter. Meanwhile, decoder 220 decodes the data received at the lane. According to one embodiment, the 8b/10b encoding technique is implemented to encode and decode the data. Ordered set transmitter 325 configures the data packets prior to packets being transmitted on a lane.

Elastic buffer 330 queues data received via a lane in order to correlate mismatches in performance speeds of two devices (e.g., devices A and B in FIG. 2). Training engine 335 is implemented to train a PCI Express interface prior to its use. Thus, training engine 335 includes testing sequences that are used to compare against sequences received via the receiver of the lane. If the comparison is positive, the interface is operating properly.

State machine 350 is implemented for several functions. According to one embodiment, IBIST initiation and test pattern sequencing is integrated with the PCI Express LTSSM state machine to provide the functionality of state machine 350. According to one embodiment, four states are added to the LTSSM state machine to support IBIST initiation. The four additional states extend the LTSSM in order to facilitate IBIST master operations. According to one embodiment, the IBIST slave device uses only the standard LTSSM states.

Figure 4:
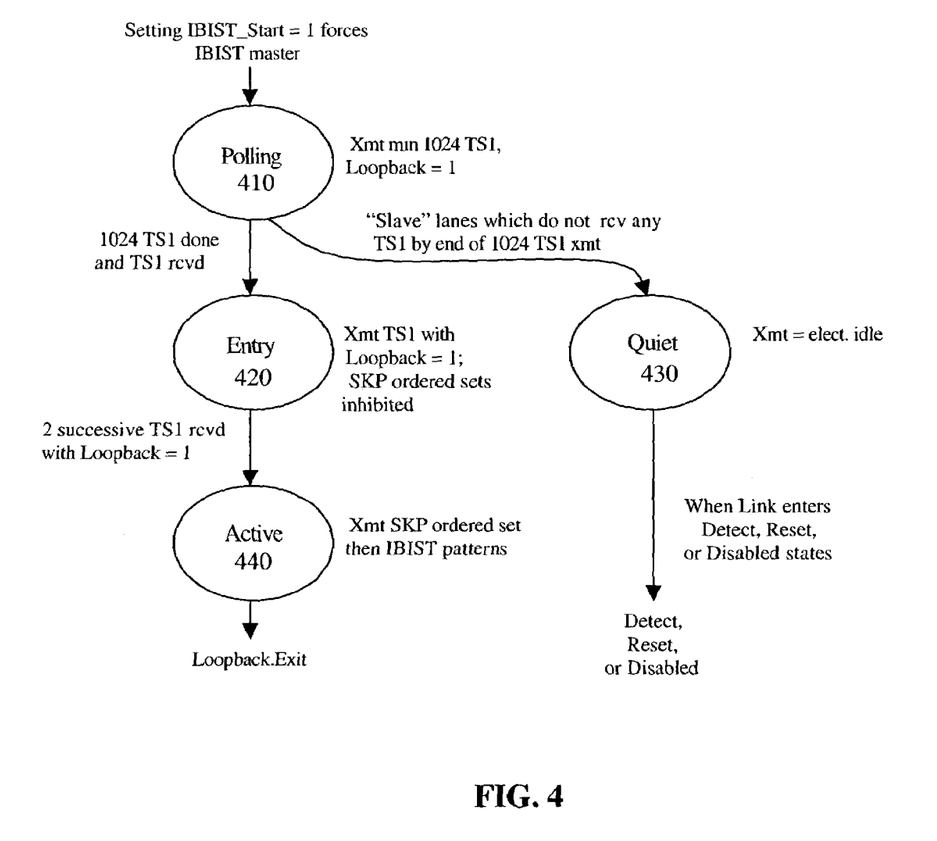
FIG. 4 illustrates one embodiment of an IBIST initiation state machine sub-segment.

FIG. 4 illustrates one embodiment of the IBIST initiation state machine sub-segment (e.g., additional states). The state machine sub-segment includes a Polling state 410, an Entry state 420, a Quiet state 430 and an Active state 440. While in Polling state 410, LinkUp is equal to 0 (e.g., status is cleared), and the data rate is as previously negotiated (e.g., left unchanged). In addition, the transmitter transmits a minimum of 1024 consecutive TS1 ordered-sets on all lanes. In one embodiment, the TS1 ordered sets have the Loopback bit set. This guarantees a minimum of 64 μs for the bit and symbol lock time for first generation data rates.

Following the transmission of the 1024 TS1 ordered-sets, the next state is Entry state 420 for lanes that have received a single TS1 or TS2 ordered-set or their compliment is received on any lane. Following the transmission of the 1024 TS1 ordered-sets, the next state is Quiet state 430 for lanes that have not received a TS1 or TS2 ordered-set, or have not been prevented from entering Entry state 420 (e.g., via bit 2 of each ports lane status register 350).

While in Entry state 420, LinkUp is equal to 0 (e.g., status is cleared), and the receiver inverts polarity if necessary. Further, the master device continues to transmit TS1 ordered sets until it receives two successive TS1 ordered-sets with the loopback bit set. In one embodiment, this indicates the loopback slave has successfully entered loopback. The next state is Active state 440.

While in the Quiet state, the lane transmitter is in electrical idle and the lane remains in Quiet state 430 until the link enters Detect, Link Reset or Disabled LTSSM states. While in the Active state, the Loopback Master sends an initial SKP ordered set to provide synchronization prior to sending the first test patterns. In addition, the Loopback Master is sending valid 8b/10b data from symbol data register 346. The Loopback Master sends additional SKP ordered sets as necessary to separate sequential pattern sets. The next state of the Loopback Master is a Loopback Exit state when the test is complete.

Figure 5:
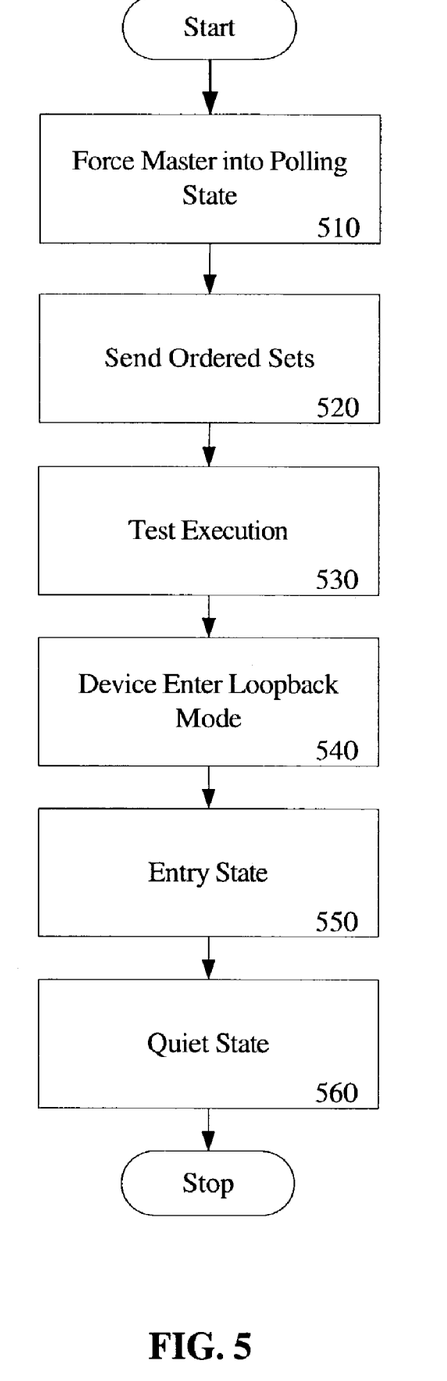
FIG. 5 is a flow diagram of one embodiment of the operation of an IBIST initiation state machine sub-segment.

FIG. 5 is a flow diagram of one embodiment of the operation of the IBIST initiation state machine sub-segment. According to one embodiment, the Loopback Slave needs no special preconditioning before an IBIST test is initiated. At processing block 510, the master is forced into Polling state 410 with an IBIST specific bit [IBIST_Start/Status-PortX in global start register/status register 341]. In one embodiment, this avoids all detect and polling states accelerating HVM and other tests).

At processing block 520, IBIST master immediately starts sending 1024 TS1 ordered-sets with the Loopback enable bit set. In one embodiment, this guarantees that a minimum of 1024 TS1 ordered-sets are sent with the loopback bit set allowing the far end to acquire bit and symbol sequence (TS1) lock, switch to loopback mode to begin sending the TS1 ordered sets back to the loopback master, and for the master receiver to also acquire bit and symbol and sequence lock. Sending 1024 TS1's insures that a link removed up to two re-timing repeaters will continue to have the ability to achieve lock. Further, this guarantees that any LAI or other external instrumentation would also have time to achieve lock.

At processing block 530, flexible lane level test execution is permitted via bit 0 of the lane status register 350. In one embodiment, testing is inhibited by setting a lane status register 350 bit 0 control bit forcing specified individual lane(s) to remain/go to disabled state when the start bit is set. At processing block 540, a device becomes an IBIST slave and enters loopback mode when the device achieves bit and symbol sync and receives TS1 ordered-sets with loopback bit set.

At processing block 550, the master enters Entry state 420 after sending the 1024 TS1s (while in Polling state 410), and disables SKP ordered set scheduling while continuing to send TS1 ordered sets (with loopback bit set). The master waits for exactly 2 TS1 ordered sets with Loopback Enable=1 on any of the echoing lanes prior to test launch.

In one embodiment, IBIST checks that at least one lane because all lanes should echo if connected. This allows for some faulty lanes. Note that because the master ignores any received TS1 ordered-set prior to entering Entry state 420, any malformed TS1 ordered sets from the loopback slave (due to the slaves transmitter switching) are ignored. The master receiver should receive only clean ordered sets at this point. At process block 560, any lanes unable to receive the echoed TS1 Ordered-set will enter Quiet state 430 unless and lane status register 350 is configured to override this.

Referring back to FIG. 3, the test pattern sequencing function of state machine 340 combined with loop counter register 343, symbol data register 346 and delay symbol register 348 enable the generation of patterns for testing PCI Express links via a pattern generator function. In yet a further embodiment, the IBIST pattern generator functions operate according to two modes: a Fixed mode and an Open mode.

The Open Mode is used for validation and debug. In particular, the Open mode combines special diagnostic capabilities with the ability to overwrite default test patterns. As a result, a user may load and execute custom test patterns for each PCI Express lane supported by IBIST, as well as customize test execution options. The Fixed mode enables automated test execution supporting validation run-in, HVM, and in-system applications, such as fault resilient booting, predictive failure analysis, and bus tuning.

According to one embodiment, the Fixed mode implements a predefined test pattern that is preset at startup in IBIST module 148. In a further embodiment, the pattern is configured to generate maximum stress conditions. In yet a further embodiment, the default settings in Fixed mode executes patterns in with delay symbol injection in order to introduce lane-to-lane crosstalk.

Figure 6:
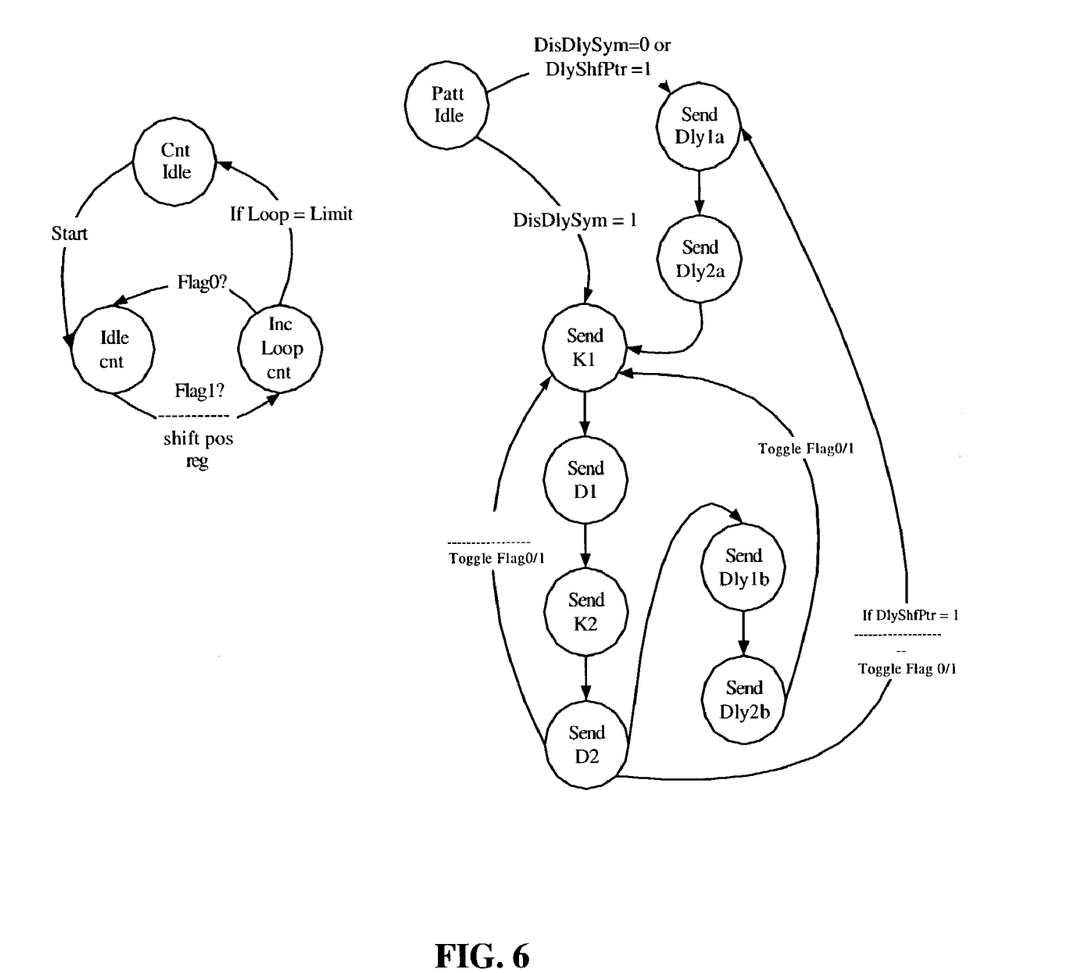
FIG. 6 illustrates one embodiment of a pattern sequencer state machine.

FIG. 6 illustrates one embodiment of the pattern sequencer state machine function implemented within state machine 350 to support the Fixed mode and the Open mode. According to one embodiment, two state machines operate jointly to supply test symbols to the PCI Express lanes and to count the number of iterations are transmitted from the transmitter component. In a further embodiment, the state machine transmits two sets of symbols prior to each counter increment. In yet another embodiment, a toggle bit in the state machine indicates when the counter is to increment.

In one embodiment, a default test sequence includes two delay symbols followed by four data symbols, and finishing with two additional delay symbols. In a further embodiment, the sequence is initiated with the delay symbol injection position set. Otherwise, the lane transmits two sets of four symbols to the transmitter. In yet another embodiment, loop counter 343 is incremented after eight symbols (e.g., 1 set of delay/data/delay symbols or 2 sets of data symbols) are sent. If delay symbol register 348 is cleared (e.g., 00), only four data symbols are sent for every loop count increment. Two Symbol data register 346 includes the test data symbols (default or user defined) to stimulate a particular link. Table 2 illustrates the symbol data register 346 format. According to one embodiment, symbol data register 346 is a 32 bit register having an offset of Base+4. In a further embodiment, a symbol data register 346 is provided for each link. However, in other embodiments, a symbol data register 346 may be shared by multiple links.

TABLE 2

| Bit | Attr | Default | Description |
|---|---|---|---|
| 32:17 | RW | 4Ah | Character Symbol [3] This character is symbol [3] of the four-symbol symbol data register 346. The default value is the 8-bit encoding for D10.2. |
| 23:16 | RW | BCh | Character Symbol [2] This character is symbol [3] of the four-symbol symbol data register 346. The default value is the 8-bit encoding for K28.5. |
| 15:8 | RW | B5h | Character Symbol [1] This character is symbol [3] of the four-symbol symbol data register 346. The default value is the 8-bit encoding for D21.5. |
| 7:0 | RW | BCh | Character Symbol [0] This character is symbol [3] of the four-symbol symbol data register 346. The default value is the 8-bit encoding for K28.5. |

Table 3 shows the default values of symbol data register 346 and a global loop count. The global loop count defines the maximum number of symbols that are transmitted in the Fixed mode test execution. The values shown in Table 3 are transmitted in 127 sets of 8 symbols (total of 1016 symbols). In addition,

TABLE 3

Symbol Buffers

| D Symbol [9][8:0] | Symbol 3 [9][8:0] | Symbol 2 [9][8:0] | Symbol 1 [9][8:0] | Symbol 0 [9][8:0] | Global Loop | Global Continue |
|---|---|---|---|---|---|---|
| K28.5 | D10.2 | K28.5 | D21.5 | K28.5 | 07Fh | 0 |

Table 3 also shows the default values that are used for Fixed mode testing. The values defined in the table are 8b/10b labeled equivalents having a 9-bit value to represent the symbols to be sent on the transmission lanes. The values reside in two registers. The 8 bit symbols reside in symbol data register 346. Further, a K-code bit for each symbol resides in control register 342.

Control register 342 includes control bits and status information used to operate the Fixed and Open modes the value of the delay symbol used in lane inversion cross-talk testing. Table 4 illustrates the control register 348 format. In addition, Table 4 defines accessible diagnostic information bits, as well as test configurable options. According to one embodiment, control symbol register 342 is a 32 bit register having an offset of Base. In a further embodiment, a symbol data register 346 is provided for each link. However, in other embodiments, a symbol data register 346 may be shared by multiple links.

TABLE 4

| Bit | Attr | Default | Description |
| --- | --- | --- | --- |
| 31 | RW | 0 | Symbol[3] Type Select<br>0: selects Symbol [3] to a data character<br>1: selects Symbol [3] as a control character |
| 30 | RW | 1 | Symbol[2] Type Select<br>0: selects Symbol [2] to a data character<br>1: selects Symbol [2] as a control character |
| 29 | RW | 0 | Symbol[1] Type Select<br>0: selects Symbol [1] to a data character<br>1: selects Symbol [1] as a control character |
| 28 | RW | 1 | Symbol[0] Type Select<br>0: selects Symbol [0] to a data character<br>1: selects Symbol [0] as a control character |
| 27 | RV | RV | Reserved |
| 26 | RO | RO | Error Symbol Delay Character<br>This bit indicates whether or not the errant symbol pointer was a delay symbol set.<br>0: Errant symbol pointer was a data symbol set<br>1: Errant symbol pointer was a delay symbol set |
| 25:23 | RO | RO | Error Symbol Pointer<br>This is a 3-bit value that indicates which symbol of the 8 possible symbols sent on the lane, as a set of characters, failed. The value corresponds to position of the counter sending the set of 8 symbols. This symbol pointer only corresponds to the first error captured according to bits [22:8] |
| 22:14 | RO | 0 | Error Value<br>This is the 9-bit error value latched by the miss-compare logic of the first lane that reported the error. |
| 13:9 | RO | 0 | Error Lane Number<br>This 5-bit value points to the first lane number reporting an error, 32 lanes can be supported by this field. Larger lane indications will require an extended register to display information. |
| 8 | RWC ST | 0 | Error Detected<br>A mis-compare between the symbol buffer and the symbol received on link indicates an error condition occurred. Refer to bits[22:9] for error details. This bit is cleared by writing a logic '1'. This bit is sticky.<br>0: No error detected<br>1: Error Detected<br>Note: This bit will be shadowed to an observability pin that can be used for IRQ generation. Or it will be conncected to the local cluster debug bus for global event generation and observability on the debug bus. Other components should make this pin observable by any appropriated means. |
| 7 | RW | 0 | Suppress Skips<br>0: Skips are still interested in the data<br>1: Skip insertion is suppressed |
| 6:4 | RW | 000 | Delay Symbol Injection Lane Number<br>This selects the Lane number modulo 8 to inject the delay symbol pattern. |
| 3 | RW | 1 | Lane auto-delay injection<br>0: IBIST does not sequence inversion<br>1: IBIST auto-sequences through the inversion |
| 2 | RW | 1 | Scrambling Bypass<br>0: Scrambling is not bypassed<br>1: Scrambling is bypassed |
| 1 | RW | 1 | Initial Disparity<br>0: Disparity starts as negative<br>1: Disparity starts as positive |
| 0 | RW | 0 | IBIST Start<br>This bit starts the IBIST control logic. The bit is cleared after the done condition is reached. If the global start/status register (IBGLBSTR) is supported then this bit is reserved.<br>0: Stop IBIST<br>1: Start IBIST |

An extended control register provides an extension to the base IBIST functionality. For instance, the extended control register includes additional controls for features like pattern loop counting, SKP ordered-set injection, and symbol management. Table 5 illustrates the extended control register format. The extended control register defines additional controls to customize debug features beyond those described in Table 4. According to one embodiment, the extended control symbol register is a 32 bit register having an offset of Base+12.

TABLE 5

| Bit | Attr | Default | Description |
| --- | --- | --- | --- |
| 31:29 | RV | 0 | Reserved |
| 28 | RW | 0 | Debug Event Start Enable |

TABLE 5-continued

| Bit | Attr | Default | Description |
|---|---|---|---|
| | | | This bit allows the ability to start the IBIST logic with the debug hooks within the chip. The capability assumes that the performance monitors or CHAP-like counters are connected to global event logic to assert the debug event start signal on the IBIST block.<br>0: Use register bit to start IBIST<br>1: Allows a Debug Event signal to start/stop IBIST. |
| 27:26 | RW | 10 | Delay Symbol Injection Enhanced<br>00: No symbols sent on lanes<br>01: Delay symbols sent on modulo 4 across the lanes<br>10: Delay symbols sent on modulo 8 across the lanes<br>11: Reserved |
| 25 | RW | 0 | Disable Stop on Error<br>0: Stop on Error<br>1: Do not stop on Error. If an error occurs overwrite error status collected from a previous error event. |
| 24 | RW | 0 | Loop Continuously<br>0: Use loop counters. Test terminates at the end of the global count.<br>1: Loop symbols in the symbol buffer continuously. |
| 23:12 | RW | 000h | Skip Count Interval<br>This register indicates when a skip order sequence is sent on the transmitter. The skip counter is cleared and counting resumes.<br>000 —No Skip Ordered Sets are sent on TX<br>nnn —The number of 8 symbol sets sent before a Skip Ordered Set is sent. |
| 11:0 | RW | 07fh | Loop Count Limit<br>This register indicates the number of times the data symbol buffer is looped as a set of 8 symbol times.<br>00: No symbols are sent from symbol buffer. If scrambling bypass is cleared then this lane sends scrambled data, otherwise TX is squelched.<br>01-FFF: 1 to 4095 sets of symbols from the symbol buffer. |

Loop counter register 343 stores the current value of the loop counter. Table 6 illustrates the loop counter register 343 format. According to one embodiment, loop counter register 343 is a 16 bit register having an offset of Base+16.

TABLE 6

| Bit | Attr | Default | Description |
|---|---|---|---|
| 15:12 | RV | 0 | Reserved |
| 11:0 | RW | 000h | Loop Count Value<br>This is the 12-bit value currently in the counter. Once the IBIST is engaged, loop counts are incremented when a set of 8 symbols have been sent to the TX lanes. |

Delay symbol register 348 stores the value of the delay symbol used in lane inversion cross-talk testing. Table 7 illustrates the delay symbol register 348 format. According to one embodiment, delay symbol register 348 is a 16 bit register having an offset of Base+18.

TABLE 7

| Bit | Attr | Default | Description |
|---|---|---|---|
| 15:9 | RV | 0 | Reserved |
| 8:0 | RW | 1BCh | Delay Symbol<br>This is the 9-bit delay symbol value used (default is K28.5). |

Table 8 illustrates the lane-to-lane cross-talk injection scheme for a modulo 4 interface. According to one embodiment, the delay symbols are strategically sequenced across the width of the interface in order to emulate maximum lane-to-lane interference. In a further embodiment, the extended control register causes the pattern in Table 8 with a bit setting of "01" in bits [27:26]. In yet another embodiment, a delay symbol is sent beginning with lane 0 and addresses a x8 PCI Express link setting with a bit of "10".

According to one embodiment, test pattern sequencing operates based upon the following rules:

1. Adjacent lanes launch combinations of K1 and K2, as well as D1's and D2's;
2. K1 next to a K2 is an inverted bit pattern; and
3. D1 next to a D2 is an inverted bit pattern;

Note that D is a character that preserves the current disparity after the two are transmitted. Any two characters that are the same fit the definition.

TABLE 8

| 1 | K1 | K1 | K1 | D | K1 | K1 | K1 | D |
|---|---|---|---|---|---|---|---|---|
| 2 | D1 | D1 | D1 | D | D1 | D1 | D1 | D |
| 3 | K2 | K2 | K2 | K1 | K2 | K2 | K2 | K1 |
| 4 | D2 | D2 | D2 | D1 | D2 | D2 | D2 | D1 |
| 5 | K1 | K1 | K1 | K2 | K1 | K1 | K1 | K2 |
| 6 | D1 | D1 | D1 | D2 | D1 | D1 | D1 | D2 |
| 7 | K2 | K2 | K2 | D | K2 | K2 | K2 | D |
| 8 | D2 | D2 | D2 | D | D2 | D2 | D2 | D |
| 9 | K1 | K1 | D | K1 | K1 | K1 | D | K1 |
| 10 | D1 | D1 | D | D1 | D1 | D1 | D | D1 |
| 11 | K2 | K2 | K1 | K2 | K2 | K2 | K1 | K2 |
| 12 | D2 | D2 | D1 | D2 | D2 | D2 | D1 | D2 |
| 13 | K1 | K1 | K2 | K1 | K1 | K1 | K2 | K1 |
| 14 | D1 | D1 | D2 | D1 | D1 | D1 | D2 | D1 |
| 15 | K2 | K2 | D | K2 | K2 | K2 | D | K2 |
| 16 | D2 | D2 | D | D2 | D2 | D2 | D | D2 |

TABLE 8-continued

| | | | | | | | |
|---|---|---|---|---|---|---|---|
| 17 | K1 | D | K1 | K1 | K1 | D | K1 | K1 |
| 18 | D1 | D | D1 | D1 | D1 | D | D1 | D1 |
| 19 | K2 | K1 | K2 | K2 | K2 | K1 | K2 | K2 |
| 20 | D2 | D1 | D2 | D2 | D2 | D1 | D2 | D2 |
| 21 | K1 | K2 | K1 | K1 | K1 | K2 | K1 | K1 |
| 22 | D1 | D2 | D1 | D1 | D1 | D2 | D1 | D1 |
| 23 | K2 | D | K2 | K2 | K2 | D | K2 | K2 |
| 24 | D2 | D | D2 | D2 | D2 | D | D2 | D2 |
| 25 | D | K1 | K1 | K1 | D | K1 | K1 | K1 |
| 26 | D | D1 | D1 | D1 | D | D1 | D1 | D1 |
| 27 | K1 | K2 | K2 | K2 | K1 | K2 | K2 | K2 |
| 28 | D1 | D2 | D2 | D2 | D1 | D2 | D2 | D2 |
| 29 | K2 | K1 | K1 | K1 | K2 | K1 | K1 | K1 |
| 30 | D2 | D1 | D1 | D1 | D2 | D1 | D1 | D1 |
| 31 | D | K2 | K2 | K2 | D | K2 | K2 | K2 |
| 32 | D | D2 | D2 | D2 | D | D2 | D2 | D2 |
| 33 | K1 | K1 | K1 | D | K1 | K1 | K1 | D |
| 34 | D1 | D1 | D1 | D | D1 | D1 | D1 | D |
| 35 | K2 | K2 | K2 | K1 | K2 | K2 | K2 | K1 |
| 36 | D2 | D2 | D2 | D1 | D2 | D2 | D2 | D1 |
| 37 | K1 | K1 | K1 | K2 | K1 | K1 | K1 | K2 |
| 38 | D1 | D1 | D1 | D2 | D1 | D1 | D1 | D2 |
| 39 | K2 | K2 | K2 | D | K2 | K2 | K2 | D |
| 40 | D2 | D2 | D2 | D | D2 | D2 | D2 | D |

According to one embodiment, the pattern generator allows additional test sequences to be used. The control settings available are defined in the control register 342 and the extended control register. The generator also allows a basic presentation of the four data symbols without the delay symbol injection format described previously.

This feature is illustrated in Table 9 as a repeating presentation of the set of four data symbols that are transmitted on a lane. In one embodiment, the loop counter is incremented for every 8 symbols sent. This operating mode is achieved by clearing bits [27:26] of the IBIST Extended Control register.

TABLE 9

| Delay Mode "00" | Inc Loop Count | | | | | | | | | | | | | | | |
|---|---|---|---|---|---|---|---|---|---|---|---|---|---|---|---|---|
| clk | 1 | 2 | 3 | 4 | 5 | 6 | 7 | 8 | 9 | 10 | 11 | 12 | 13 | 14 | 15 | 16 |
| Lane 0 | K1 | D1 | K2 | D2 | K1 | D1 | K2 | D2 | K1 | D1 | K2 | D2 | K1 | D1 | K2 | D2 |
| Lane 1 | K1 | D1 | K2 | D2 | K1 | D1 | K2 | D2 | K1 | D1 | K2 | D2 | K1 | D1 | K2 | D2 |
| Lane 2 | K1 | D1 | K2 | D2 | K1 | D1 | K2 | D2 | K1 | D1 | K2 | D2 | K1 | D1 | K2 | D2 |
| Lane 3 | K1 | D1 | K2 | D2 | K1 | D1 | K2 | D2 | K1 | D1 | K2 | D2 | K1 | D1 | K2 | D2 |
| Lane 4 | K1 | D1 | K2 | D2 | K1 | D1 | K2 | D2 | K1 | D1 | K2 | D2 | K1 | D1 | K2 | D2 |
| Lane 5 | K1 | D1 | K2 | D2 | K1 | D1 | K2 | D2 | K1 | D1 | K2 | D2 | K1 | D1 | K2 | D2 |
| Lane 6 | K1 | D1 | K2 | D2 | K1 | D1 | K2 | D2 | K1 | D1 | K2 | D2 | K1 | D1 | K2 | D2 |
| Lane 7 | K1 | D1 | K2 | D2 | K1 | D1 | K2 | D2 | K1 | D1 | K2 | D2 | K1 | D1 | K2 | D2 |

In one embodiment, debug capabilities are available through settings in the extended control register. One such feature enables continuous looping. The typical usage model for this feature is to have the pattern loop forever to allow examination of the link waveforms while adjusting physical layer IO controls.

Table 10 illustrates the global start/status register 341. According to one embodiment, global start/status register 341 is a 32 bit register having an offset of Base+8. In a further embodiment, one global register supports each device, and is not be duplicated for each port. However, global start/status register 341 may reside in segments within each link.

TABLE 10

| Bit | Attr | Default | Description |
|---|---|---|---|
| 31:19 | RO | 0 | Reserved for more port error status bits |
| 18 | RWST | 0 | Port Error Detected on port2<br>This bit the OR of all lanes bits for this port.<br>This bit is sticky and can be cleared<br>by power good reset or software writing a<br>logic '1'.<br>0: No error detected<br>1: Error detected |
| 17 | RWST | 0 | Port Error Detected on port1<br>This bit the OR of all lanes bits for this port.<br>This bit is sticky and can be cleared<br>by power good reset or software writing a<br>logic '1'.<br>0: No error detected<br>1: Error detected |
| 16 | RWST | 0 | Port Error Detected on port0<br>This bit the OR of all lanes bits for this port.<br>This bit is sticky and can be cleared<br>by power good reset or software writing a<br>logic '1'.<br>0: No error detected<br>1: Error detected |
| 15:3 | RW | 0 | Reserved for more port start bits |
| 2 | RW | 0 | IBIST Start/Status Port2<br>Cleared on done by IBIST control logic.<br>When the global loop count value is<br>reached this bit is cleared.<br>0: Stop IBIST on port 2<br>1: Start IBIST on port 2 |
| 1 | RW | 0 | IBIST Start/Status Port1<br>Cleared on done by IBIST control logic.<br>When the global loop count value is<br>reached this bit is cleared.<br>0: Stop IBIST on port 1<br>1: Start IBIST on port 1 |
| 0 | RW | 0 | IBIST Start/Status Port0<br>Cleared on done by IBIST control logic.<br>When the global loop count value is<br>reached this bit is cleared. |

TABLE 10-continued

| Bit | Attr | Default | Description |
|---|---|---|---|
| | | | 0: Stop IBIST on port 0<br>1: Start IBIST on port 0 |

Global start/status register 341 register includes the global start and error bits for simultaneously operating all of the links in a component. According to one embodiment, the fields in the global start/status register 341 represent a component, which contains 3-x8 PCI Express ports with an IBIST block integrated for each x8 link. In a further embodiment, the length of register 341 is variable and is dependent on the number of ports requiring support.

Table 11 illustrates lane status register 350. Lane status register 350 register stores the error status for individual lanes of the link. According to one embodiment, lane status register 350 is an 8 bit register having an offset of Base+20+N (lanes).

TABLE 11

| Bit | Attr | Default | Description |
|---|---|---|---|
| 7 | RO | 0 | Error Symbol Pointer Type<br>This bit indicates whether or not the errant symbol pointer was a delay symbol set.<br>0: Errant symbol pointer was a DATA symbol set<br>1: Errant symbol pointer was a DELAY symbol set |
| 6:4 | RO | 0 | Error Symbol Pointer<br>This is a 3-bit value that indicates which symbol of the 8 possible symbols sent on the lane, as a set of characters, failed. The value corresponds to position of the counter sending the set of 8 symbols. |
| 3 | RWC | 0 | Entered Master Active State Status: This bit is set by the logic when the loopback state was entered. Write a logic '1' to clear.<br>0: Normal IBIST operation has not occurred.<br>1: Normal IBIST test began. |
| 2 | RW | 0 | Force Entry into Master Active State: If you have this bit set then the state machine is forced to exit the Entry state into Active state with the other lanes in the port.<br>0: Execute normally<br>1: Force to Active instead of Quiet state |
| 1 | RWC ST | 0 | Error Detection Per Lane<br>Error assertion for this lane. Writing a logic '1' will clear this bit. This bit is sticky.<br>0: No error on this lane<br>1: Error has occurred on this lane |
| 0 | RW | 1 | Lane Start Enable<br>0: This lane is not testing when the port start bit is asserted and remains in disable state (for this lane).<br>1: Allows the port start bit to begin IBIST symbol operations on this lane. |

The status indicates the error, a pointer to the symbol of the miss-compare and which set of symbols the receiver was comparing against (e.g., a standard set of 8 data symbols or a delay symbol set). The Lane Start Enable bit allows selective testing of lanes by enabling which lane(s) execute the IBIST test sequence. In one embodiment, a lane Status register 350 is included to support each lane in a PCI Express link, and is controlled by the control register 342.

According to one embodiment, error checking, is continuously performed during test execution in both the Fixed and Open modes. The error checking logic provides a result at the conclusion of a test. In one embodiment, if the CMM compatible pattern methodology is the only feature implemented (e.g., no additional IBIST extensions), the test concludes programmatically (e.g., software stopping the test sequence). The error comparison is completed after the reception of the electrical idle ordered set (which frames the test data) is detected.

In one embodiment, there are two error-checking methodology options defined in this document. One method is a direct symbol compare method, which is used to step through the data symbols defined in symbol data register 346 and compare those symbols with the symbols received via the link. During IBIST operation a repeating pattern of four symbols (plus delay symbols, if used) are sent from symbol data register 346 to the transmitter.

Once the data is looped back around through the loopback mechanism, a comparison is performed for on each symbol received with the corresponding symbol position in symbol data register 346. A miss-compare between the symbol received and the expected symbol will indicate an error in control register 342, along with the errant symbol value and the lane that detected the error. The compare is synchronized with the detection of the test symbol start and stop conditions.

Figure 7:
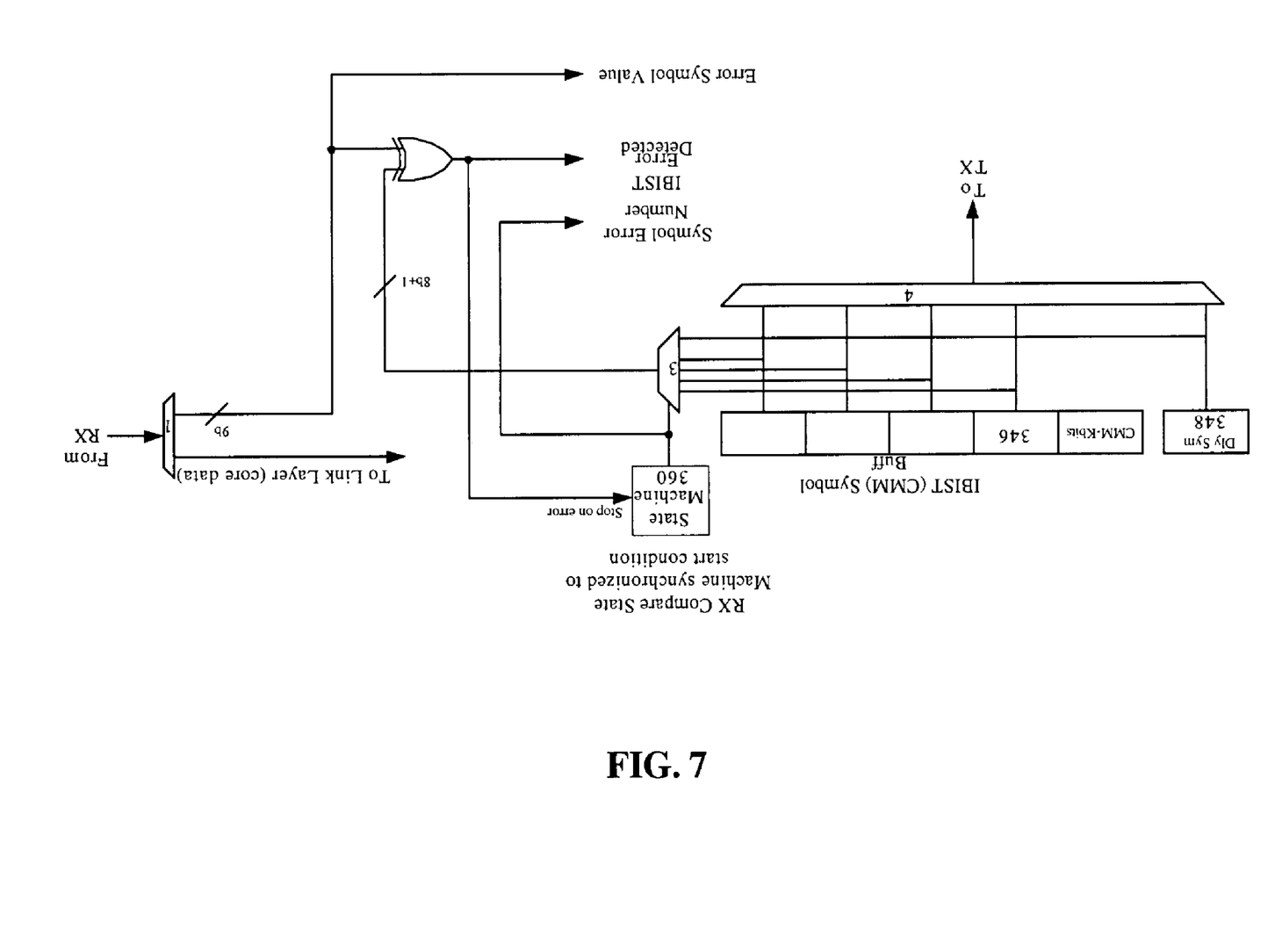
FIG. 7 illustrates one embodiment of error detection logic.

FIG. 7 illustrates one embodiment of logic used for the direct symbol compare testing methodology. As shown in FIG. 7, the symbol received is compared to that of register 346 regardless of what is being sent on the transmitter. Once the receiver detects the beginning of an IBIST operation compare state machine 360 is synchronized with the first symbol in register 346.

If a miss-compare occurs, all relevant failure data is stored in control register 342 and lane status register 350. Continuation after an error is detected is programmable via the extended control register. The error indication signal is routed out to an event logic bus or pilot mode to support Bit Error Rate Testing (BERT).

Once the receiver is synchronized, each symbol of the payload is compared with the contents of the corresponding symbol in the register 346. On each PCI Express core base clock, the pointer of the receiver compare logic is incremented and looped continuously on the set of four symbols (plus delay). In one embodiment, compares occur on each subsequent symbol received until the completion of the test. The first error is recorded as it occurs. The errant symbol, the pointer to register 346 and the error indication is recorded in control register 342 and lane status register 350.

Figure 8:
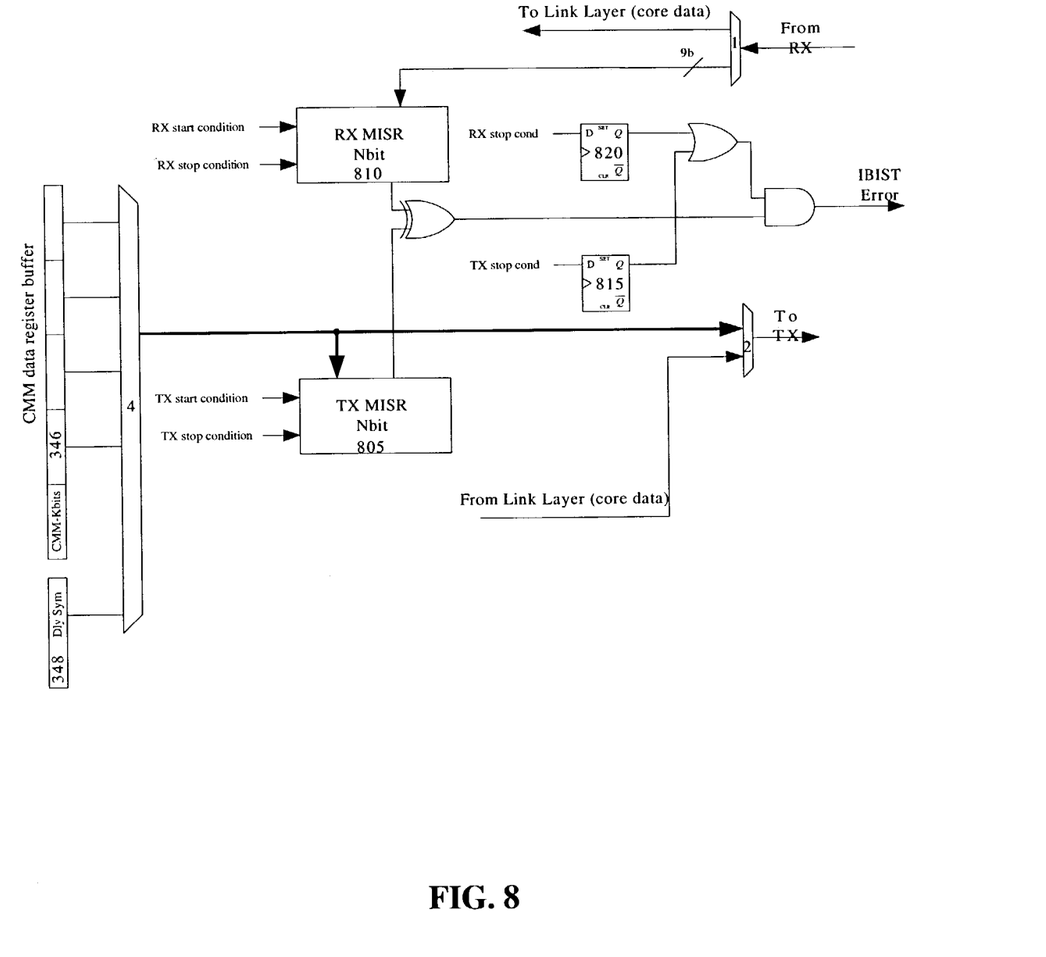
FIG. 8 illustrates another embodiment of error detection logic.

Another testing methodology is the multiple input signature register (MISR) compare method. FIG. 8 illustrates one embodiment of logic used for the MISR compare testing methodology. The MISR method implements two registers, transmit register 805 and receive register 810, which accumulate signatures and perform comparisons at end of a test. Also included are shift registers 815 and 820.

The MISR implementation accomplishes error checking by generating and comparing signatures rather than conducting direct symbol compares. An error assertion is produced when a miss-compare of two stored accumulated MISR signatures. In one embodiment, a signature of the transmitted data is compared with the signature generated at the receiver. Each MISR is controlled independently based on previously defined start and stop criteria sections.

A multiple input signature register (MISR) is implemented with a shift register with feedback XOR'ed back into the input of the shift chain. The shift register bits (e.g., coefficients) selected to form the feedback mechanism are based on an irreducible polynomial. In one embodiment, irreducible polynomials are utilized since they guarantee unique signatures over the maximum range of accumulated values In a further embodiment, signature accumulation is complete after the detection of an electrical idle ordered-set (EIOS) or a Skip Ordered Sequence (SOS). The transmitter and receiver are framed with their own set of conditions (e.g., the transmitter frames with post-training Skip Ordered sequence (SOS) and ends with sending EIOS). The receiver frames with receiving a post-training SOS and ends with receiving EIOS. MISR 805 and 810 are compared after each having received their indication of the EIOS or SOS sequence.

In one embodiment, the error signal is made available to the core for accumulating via performance counters or other similar structures for Bit Error Rate Testing (BERT). Error results are stored in the lane control register 350 and control register 342. In a further embodiment, MISR 805 is pre-loaded with a signature value that is used to compare the results of the receiver. Thus, the MISR 810 is disconnected from the transmitter symbol generator so that the value cannot be overwritten.

IBIST applies on-die testing methodology to a new environment, such as on-die test circuitry purposed for board and system level defect detection and auto-diagnosis). In addition, the IBIST architecture for PCI Express modifies the LTSSM state machine in a novel way to facilitate component-to-component test synchronization.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. An apparatus comprising:
a PCI Express bus having two or more lanes;
a first transmitter component coupled to a first lane of the PCI Express bus;
a second transmitter component coupled to a second lane of the PCI Express bus, the first and second transmitter components each having:
a pattern generator to generate test patterns; and
a serializer to serialize data to be transmitted from the transmitter on to the PCI Express bus;
a first receiver component coupled to the first lane of the PCI Express bus having a first pattern checker to receive the test pattern from the first lane; and
a second receiver component coupled to the second lane of the PCI Express bus having a second pattern checker to receive the test pattern from the second lane.

2. The apparatus of claim 1, further comprising:
a first debug module to correct errors detected at the first pattern checker; and
a second debug module to correct errors detected at the second pattern checker.

3. The apparatus of claim 1, wherein the first and second receiver components further comprises a deserializer.

4. The apparatus of claim 1, wherein the first and second pattern generators stores a first pattern of bits.

5. The apparatus of claim 4, wherein the first and second pattern checkers stores a second pattern of bits.

6. The apparatus of claim 5, wherein the first and second pattern checkers compares a pattern received from the first and second lanes with the second pattern of bits stored in the first and second pattern checkers.

7. The apparatus of claim 6, wherein the first and second receiver components includes logic to determine if an error occurs while transferring a pattern from the first and second transmitter components to the first and second receiver components, the logic operating based on the comparison.

8. The apparatus of claim 7, wherein the apparatus includes a mechanism to load a user defined pattern of bits into the first and second pattern generators as the first pattern of bits and to load the user defined pattern of bits into the first and second pattern checkers as the second pattern of bits.

9. The apparatus of claim 6, wherein the first and second pattern checkers compares the received pattern wit the second pattern of bits stored in the first and second pattern generators based upon a direct compare method.

10. The apparatus of claim 6, wherein the first and second pattern checkers compares the received patterns with the second pattern of bits based upon a multiple input register (MISR) testing methodology.

11. The apparatus of claim 1, further comprising logic to switch between a normal mode and a test mode, the first and second pattern checkers, operating in the test mode to determine if an error occurs during transmission of bits across the PCI Express bus.

12. The apparatus of claim 1, further comprising:
a training buffer to train the first and second lanes by testing sequences that are to be received via the first and second receivers.

13. The apparatus of claim 1, wherein the first and second pattern checkers and the first and second pattern generators comprise on-die circuitry provided within silicon of the apparatus.

14. A computer system comprising:
a point-to-point serial interconnect coupled to a transmitter component and a receiver component; and
a chipset, coupled to the point-to-point serial interconnect, including:
a first transmitter component coupled to a PCI Express bus;
a second transmitter component coupled to a second lane of the PCI Express bus, the first and second transmitter each having:
a pattern generator to generate test patterns; and
a serializer to serialize data to be transmitted from the transmitter on to the PCI Express bus;
a first receiver component coupled to the first lane of the PCI Express bus having a first pattern. checker to receive the test pattern from the first lane; and
a second receiver component coupled to the second lane of the PCI Express bus having a second pattern checker to receive the test pattern from the second lane.

15. The computer system of claim 14, wherein the chipset further comprises:
a first debug module to correct errors detected at the first pattern checker; and a second debug module to correct errors detected at the second pattern checker.

16. The computer system of claim 14, wherein the first and second receiver components further comprises a deserializer.

17. The computer system of claim 14, wherein the chipset includes a mechanism to load a user defined pattern of bits into the first and second pattern generators as the first pattern of bits and to load the user defined pattern of bits into the first and second pattern checkers as the second pattern of bits.

18. The computer system of claim 17, wherein the first and second pattern checkers compares a pattern received from the first and second lanes with the second pattern of bits stored in the first and second pattern checkers.

19. The computer system of claim 17, wherein the first and second pattern checker compares the received patterns with the second pattern of bits based upon a multiple input register (MISR) testing methodology.

20. The computer system of claim 14, wherein the interconnect comprises a PCI Express bus.

* * * * *